(12) United States Patent
Hauf et al.

(10) Patent No.: US 8,593,014 B2
(45) Date of Patent: Nov. 26, 2013

(54) METHOD OF OPERATION AND DEVICE FOR CONTROLLING AN ENERGY INSTALLATION WITH PHOTOVOLTAIC MODULES

(76) Inventors: Harald Hauf, La Seyne sur Mer (FR); Sothachett Van, Le Versoud (FR)

( * ) Notice: Subject to any disclaimer, the term of this patent is extended or adjusted under 35 U.S.C. 154(b) by 159 days.

(21) Appl. No.: 12/773,447

(22) Filed: May 4, 2010

(65) Prior Publication Data

US 2010/0250018 A1    Sep. 30, 2010

Related U.S. Application Data

(63) Continuation of application No. PCT/IB2008/002829, filed on Oct. 21, 2008.

(30) Foreign Application Priority Data

Nov. 8, 2007   (FR) ...................................... 07 58882

(51) Int. Cl.
*G06F 1/28*        (2006.01)
*G01R 21/06*       (2006.01)

(52) U.S. Cl.
USPC ............................................. 307/86; 307/71

(58) Field of Classification Search
USPC .................... 307/69, 71, 77, 84–86
See application file for complete search history.

(56) References Cited

U.S. PATENT DOCUMENTS

| 4,494,180 | A  | * | 1/1985 | Streater et al. .................. 363/37 |
| 5,449,959 | A  | * | 9/1995 | Yang ............................... 307/81 |
| 6,060,790 | A  |   | 5/2000 | Craig, Jr. |
| 6,583,522 | B1 |   | 6/2003 | McNulty et al. |
| 6,750,391 | B2 | * | 6/2004 | Bower et al. .................. 136/244 |
| 2007/0034246 | A1 | | 2/2007 | Nakata |
| 2007/0107767 | A1 | | 5/2007 | Hayden et al. |

OTHER PUBLICATIONS

International Preliminary Report on Patentability and Written Opinion issued on May 11, 2010 in International Application No. PCT/IB2008/002829 with attached translation issued on Jun. 1, 2010.

* cited by examiner

*Primary Examiner* — Tony Ko
(74) *Attorney, Agent, or Firm* — Panitch Schwarze Belisario & Nadel LLP

(57) ABSTRACT

Method of operating and device for controlling an energy installation comprising photovoltaic modules (401) and inverters (402), in which a selection and control unit (404) selects combinations of connections of the photovoltaic modules and controls a switching unit so as to establish combinations.

3 Claims, 9 Drawing Sheets

METHOD OF OPERATION AND DEVICE FOR CONTROLLING AN ENERGY INSTALLATION WITH PHOTOVOLTAIC MODULES

CROSS-REFERENCE TO RELATED APPLICATIONS

This application is a Continuation of International Application No. PCT/IB2008/002829, filed Oct. 21, 2008, which was published in the French language on May 14, 2009, under International Publication No. WO 2009/060273 A1 and the disclosure of which is incorporated herein by reference.

BACKGROUND OF THE INVENTION

The present invention relates to the field of energy installations comprising photovoltaic modules.

It is common to produce energy installations that comprise photovoltaic modules generally consisting of panels of photovoltaic cells linked to each other, in a fixed manner, either in parallel or in series to an inverter which converts the direct current it receives into an alternating current. The pre-established choice of the connection mode depends on the electrical features of the photovoltaic modules chosen, generally the maximum power they can supply according to the sunlight in the place accommodating such modules, and depends on the electrical features of the inverter chosen, generally the input electrical power for which its output electrical power is maximum.

The present invention aims to improve the performance of energy installations with photovoltaic modules, by taking into account not only the individual electrical features of the latter but also the variable sunlight and environmental conditions of the determined places in which they are placed.

BRIEF SUMMARY OF THE INVENTION

The object of the present invention is to provide a method for operating an energy installation comprising at least two photovoltaic modules and an inverter.

This method comprises, respectively at pre-determined times, the following steps:

measuring the values of the current and/or of the voltage supplied by each photovoltaic module;

calculating and/or choosing a first electrical magnitude according to the values measured in the event that said photovoltaic modules are connected in a parallel mode and a second electrical magnitude according to the values measured in the event that said photovoltaic modules are connected in a series mode;

comparing said first and second electrical magnitudes with each other and/or with a reference magnitude;

then selecting and establishing a connection mode of connecting the photovoltaic modules to the inverter according to the result of the comparison.

According to the present invention, said first and second electrical magnitudes can be first and second electrical powers and the connection mode corresponding to the highest power calculated can be chosen and established.

According to the present invention, the first and second electrical magnitudes can be current values and the connection mode corresponding to the highest current calculated can be chosen and established.

The present invention also aims to provide a method for operating an energy installation comprising multiple photovoltaic modules and at least one inverter.

This method comprises, respectively at pre-determined times, the following steps:

measuring the values of the current and/or of the voltage supplied by each photovoltaic module;

calculating and/or choosing intermediate electrical magnitudes corresponding respectively to multiple various connection modes for connecting said photovoltaic modules in series mode and/or in parallel mode;

comparing the intermediate electrical magnitudes with each other and/or with a reference magnitude;

then selecting and establishing a connection mode of connecting the photovoltaic modules to the inverter according to the result of the comparison.

According to the present invention, said intermediate electrical magnitudes can be electrical powers and the connection mode corresponding to the highest power calculated can be chosen and established.

The present invention also aims to provide a method for operating an energy installation comprising at least one photovoltaic module and at least two inverters characterized by operating magnitudes and/or various ranges of operating magnitudes.

This method comprises, respectively at pre-determined times, the following steps:

measuring the values of the current and/or of the voltage supplied by the photovoltaic module;

calculating and/or choosing an intermediate electrical magnitude according to the values measured;

comparing this intermediate electrical magnitude with at least one reference magnitude and/or at least one range of reference magnitudes electrically characterizing each of said inverters;

then linking said module either to one of said inverters or to the other according to the result of said comparison.

The present invention also aims to provide a method for operating an energy installation comprising multiple photovoltaic modules and multiple inverters characterized by operating magnitudes and/or various ranges of operating magnitudes.

This method comprises, respectively at pre-determined times, the following steps:

measuring the values of the current and/or of the voltage supplied by each photovoltaic module;

calculating and/or choosing intermediate electrical magnitudes according to multiple various connection modes for connecting the photovoltaic modules to the inverters in series mode and/or in parallel mode;

comparing the intermediate electrical magnitudes with each other and/or with reference magnitudes and/or ranges of reference magnitudes electrically characterizing the inverters;

and selecting and establishing a connection mode of connecting the photovoltaic modules to said inverters for which the intermediate electrical magnitude corresponds approximately to a reference electrical magnitude and/or a range of reference electrical magnitudes electrically characterizing at least one of the inverters.

According to the present invention, the electrical magnitudes can be electrical powers or currents.

The present invention also aims to provide a method for operating an energy installation comprising multiple photovoltaic modules and multiple inverters characterized by operating magnitudes and/or various ranges of operating magnitudes, said method comprising, respectively at pre-determined times, the following steps:

measuring the values of the current and/or of the voltage supplied by each photovoltaic module;

calculating output electrical magnitudes of the inverters according to multiple various connection modes for connecting the photovoltaic modules to the inverters in series mode and/or in parallel mode and according to operating electrical magnitudes and/or ranges of operating electrical magnitudes electrically characterizing the inverters, comparing the output electrical magnitudes calculated, selecting and establishing a connection mode of connecting the photovoltaic modules to said inverters for which the calculated output electrical magnitude of at least one of the inverters corresponds approximately to a reference magnitude and/or a range of reference magnitudes electrically characterizing that inverter.

According to the present invention, the electrical magnitudes can be electrical powers and the operating magnitudes and/or ranges of operating magnitudes can be power curves.

The present invention also aims to provide a device for controlling an energy installation comprising multiple photovoltaic modules and at least one inverter.

This device comprises: switching means to selectively link said photovoltaic modules to said inverter by connecting them selectively in parallel mode and/or in series mode; means for measuring the value of the current and/or of the voltage supplied by said photovoltaic modules; and means for managing and controlling the switching means according to the values measured.

The present invention also aims to provide a device for controlling an energy installation comprising multiple photovoltaic modules and multiple inverters.

This device comprises: first switching means to selectively put said photovoltaic modules into parallel mode and/or into series mode selectively to pairs of intermediate terminals, second switching means to selectively link said pairs of intermediate terminals to the inverters in parallel mode and/or in series mode, means for measuring the value of the current and/or of the voltage supplied by each photovoltaic module, and means for managing and controlling the first and second switching means according to the values measured and/or according to electrical magnitudes or ranges of electrical magnitudes characterizing said inverters.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

The present invention will be better understood in the light of a study of different energy installations and their operating modes, described as non-limitative examples and illustrated by the figure appended, in which in the drawings.

DETAILED DESCRIPTION OF THE INVENTION

Figure 1:
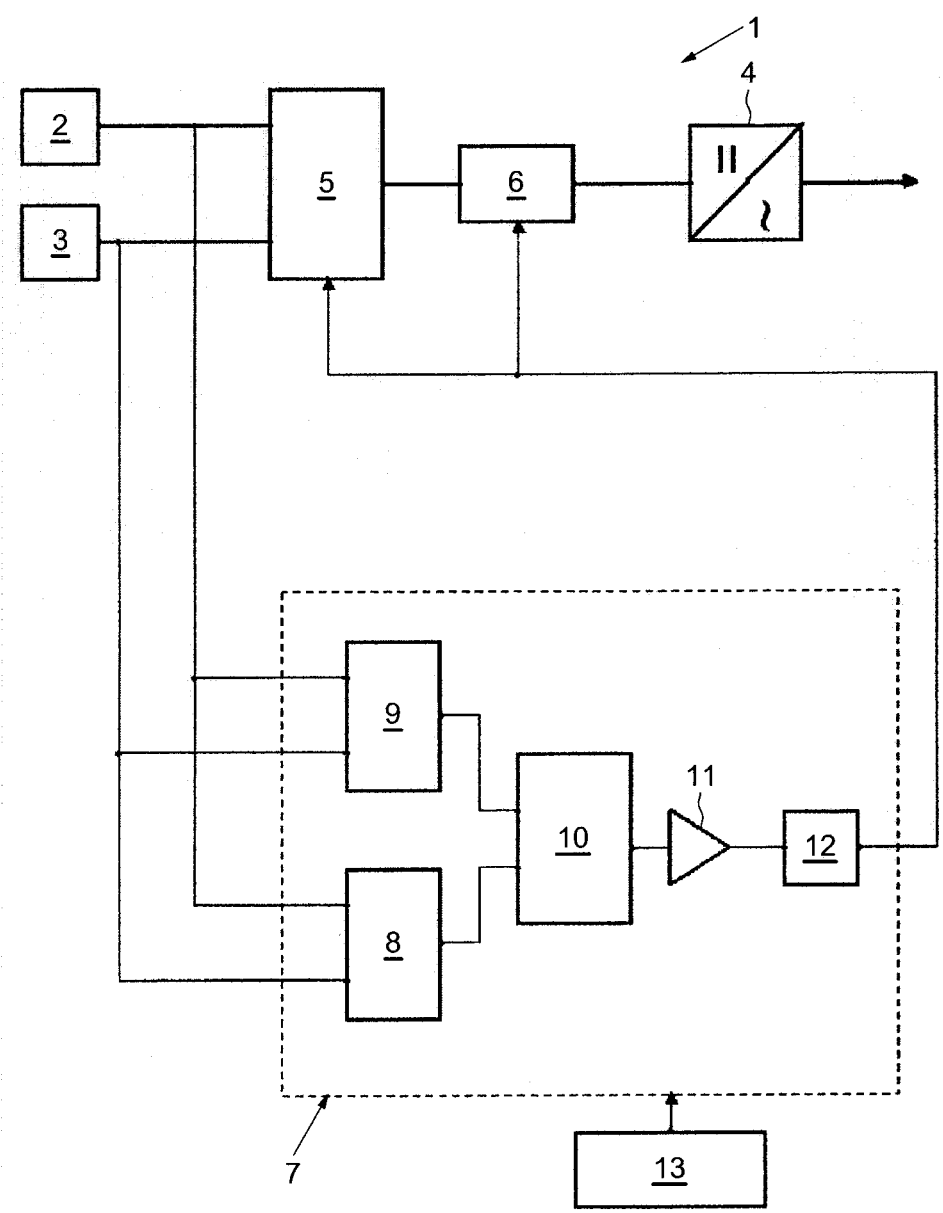
FIG. 1 is schematically represents an energy installation according to the present invention.
Figure 2:
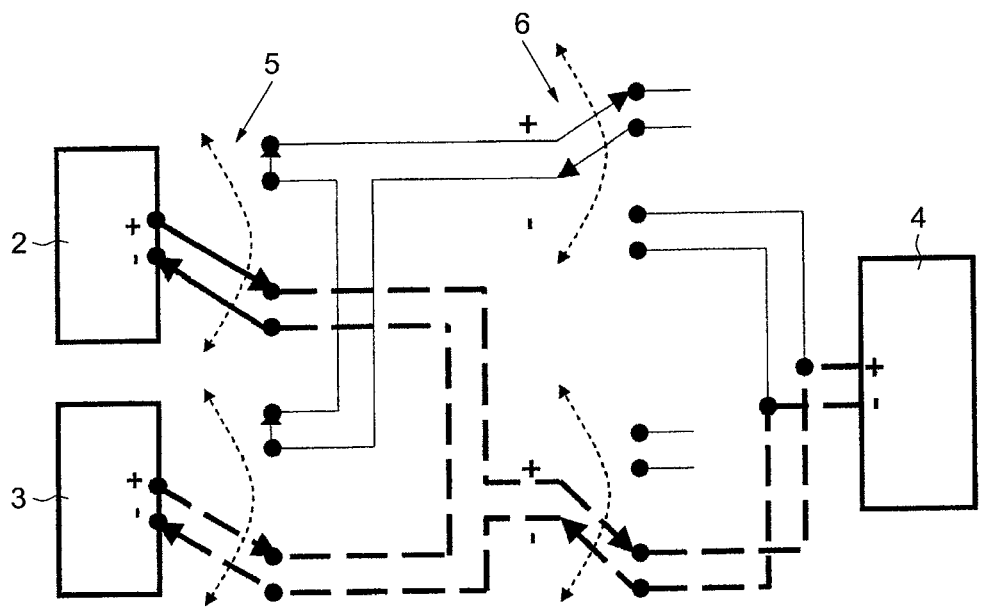
FIG. 2 is schematically represents an operating mode of the energy installation in FIG. 1.
Figure 3:
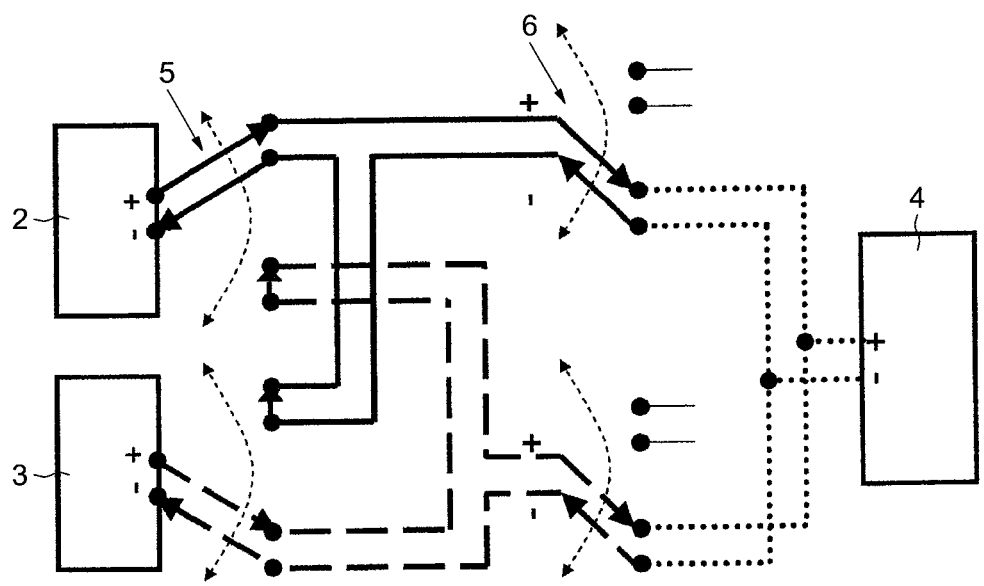
FIG. 3 is schematically represents another operating mode of the energy installation in FIG. 1.

FIGS. 1 to 3 show an energy installation 1 which comprises two photovoltaic modules 2 and 3, and an inverter 4, as well as a first group of electric switches 5 and a second group of electric switches 6 mounted between the photovoltaic modules 2 and 3 and the inverter 4.

The group of electric switches 5 and the second group of electric switches 6 are arranged such that the terminals of the photovoltaic modules 2 and 3 can be linked or connected to the terminals (+) and (−) of the inverter 4 either in parallel mode Mp or in series mode Ms.

The energy installation 1 further comprises an electronic circuit 7 for managing and controlling the electric switches of each of the groups 5 and 6 of electric switches.

The electronic circuit 7 comprises a measuring unit 8 for measuring the current supplied by each of the photovoltaic modules 2 and 3, an associated unit 8a for temporarily storing the values of the currents measured, a unit 9 for measuring the voltage supplied by each of the photovoltaic modules 2 and 3, and an associated unit 9a for temporarily storing the values of the voltages measured.

The electronic circuit 7 further comprises a calculation unit 10 adapted for calculating, by applying the calculation formulas known to those skilled in the art, the electrical power Pp likely to be supplied to the inverter 4 in the event that the photovoltaic modules 2 and 3 are connected in parallel mode Mp and the electrical power Ps likely to be supplied to the inverter 4 in the event that the photovoltaic modules 2 and 3 are connected in series mode Ms.

The electronic circuit 7 further comprises a comparison unit 11 adapted for comparing the electrical powers Pp and Ps calculated.

The electronic circuit 7 further comprises a selection and control unit 12 which is adapted or programmed for selecting the connection mode corresponding to the highest electrical power and for controlling the electric switches of each of the groups 5 and 6 of electric switches to connect the photovoltaic modules 2 and 3 to the inverter 4 in accordance with the connection mode chosen or selected.

The electronic circuit 7 is subject to a clock 13 adapted for supplying the electronic circuit 7 with a clock signal Sh, at pre-determined times, so as to trigger, upon each clock signal, a connection mode selection cycle. The time differences separating two clock signals can be constant or variable. For example, a clock signal Sh can be supplied every fifteen minutes.

Thus, upon each clock signal, a measuring command is sent to the measuring units 8 and 9, a calculation command is sent to the calculation unit 10, a comparison command is sent to the comparison unit 11 and a selection and control command is sent to the selection and control unit 12.

If the calculated power Ps is higher than the calculated power Pp, the selection and control unit 11 selects the serial mode Ms and controls the electric switches of each of the groups 5 and 6 of electric switches so that the photovoltaic modules 2 and 3 are linked to the inverter 4 in series mode Ms. This connection mode is represented in FIG. 2.

If the calculated electrical power Pp is higher than the calculated electrical power Ps, the selection and control unit 11 selects the parallel mode Mp and controls the electric switches of each of the groups 5 and 6 of electric switches so that the photovoltaic modules 2 and 3 are linked to the inverter 4 in parallel mode Mp. This connection mode is represented in FIG. 3.

The connection mode established is maintained until the next connection mode selection cycle. Upon each connection mode selection cycle, the connection mode previously established is maintained or changed according to the result of the comparison of the calculated electrical powers Pp and Ps.

In a simplified alternative, only the signals coming from the current measuring sensors 8 could be considered, while estimating that the voltages at the terminals of the modules are almost the same.

It will be understood that the number of photovoltaic modules is not limited to two. The description above can also apply to any number of photovoltaic modules.

Figure 4:
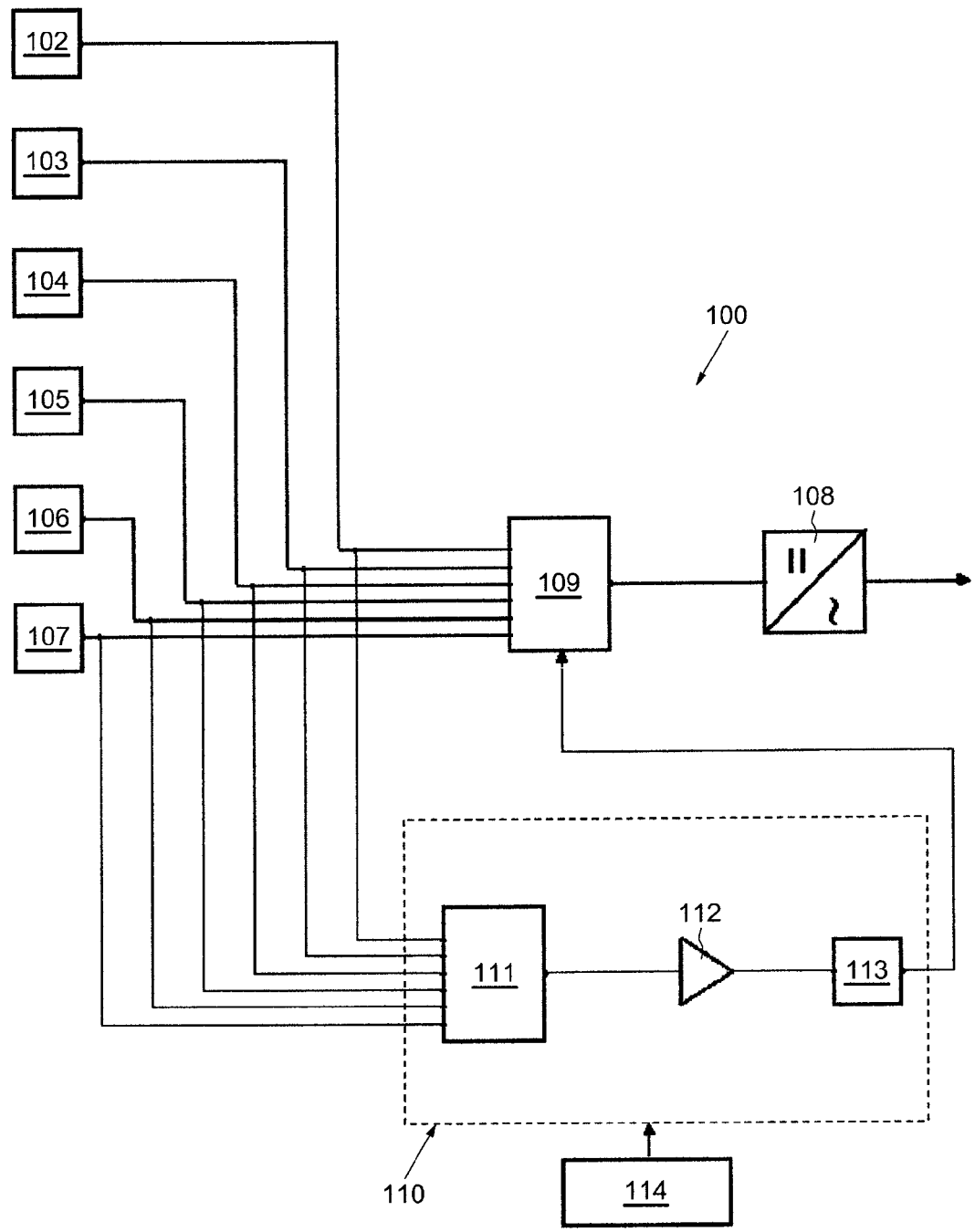
FIG. 4 is schematically represents another energy installation according to the present invention.
Figure 5:
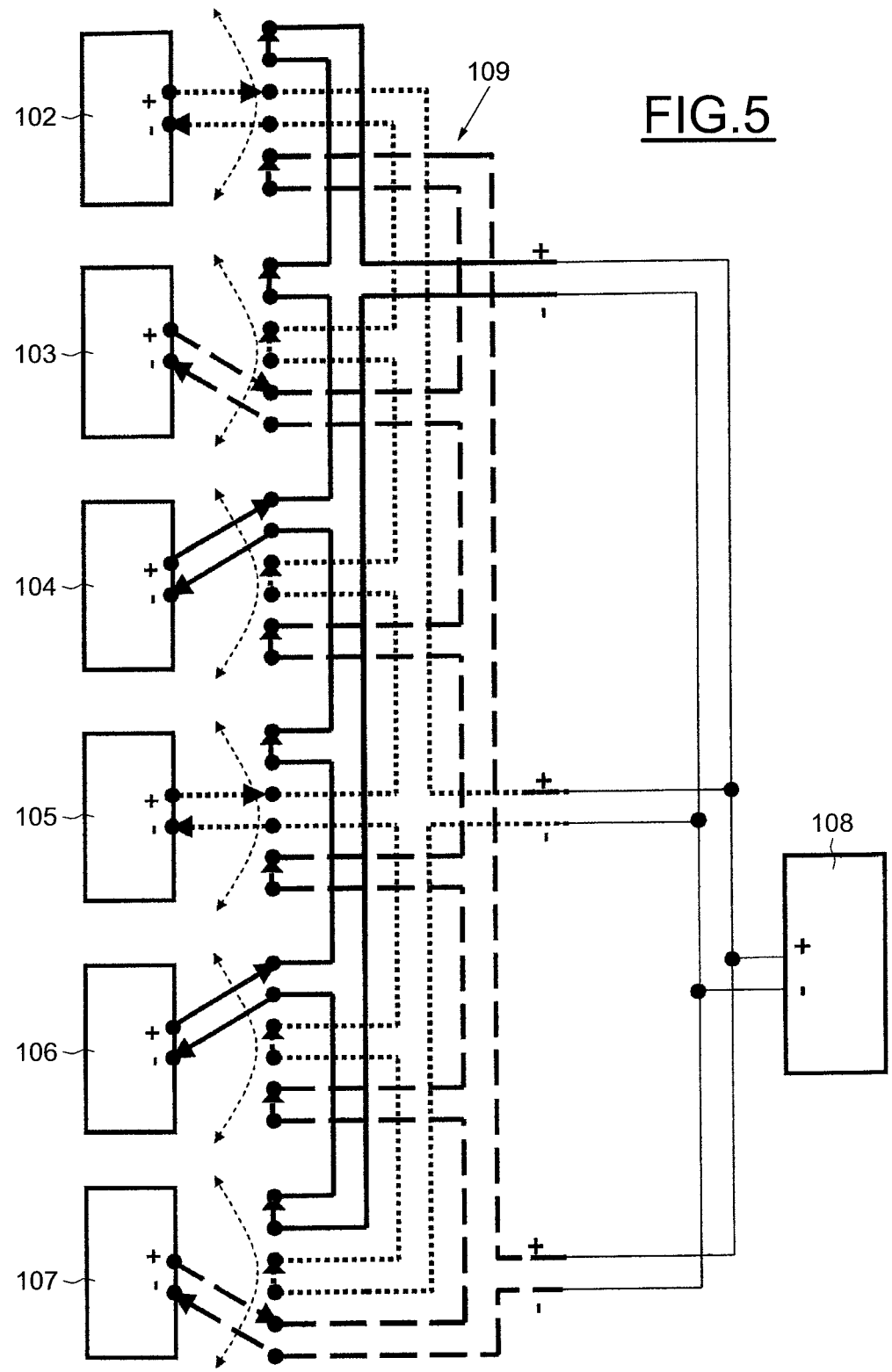
FIG. 5 is schematically represents an operating mode of the energy installation in FIG. 4.

FIGS. 4 and 5 show an energy installation 100 which comprises six photovoltaic modules 102, 103, 104, 105, 106 and 107 and an inverter 108, as well as a group of electric switches 109 mounted between the photovoltaic modules 102 to 107 and the inverter 108.

The group of electric switches 109 is arranged so that, out of the fifteen possible combinations, three connection modes in series Ms can be established between the output terminals of the photovoltaic modules 102 to 107 and the input terminals of the inverter 108, each connection mode in series Ms comprising any two of these photovoltaic modules 102 to 107 put in series, which are therefore connected, in pairs in series, in parallel mode Mp to the input terminals of the inverter 108.

The energy installation 100 further comprises an electronic circuit 110 for managing and controlling the electric switches of the group 109 of electric switches.

The electronic circuit 110 comprises a measuring unit 111 for measuring the current supplied by each of the photovoltaic modules 102 to 107.

The electronic circuit 110 further comprises a comparison unit 112 adapted or programmed for classifying in ascending, or respectively descending order, the measured values of the currents.

The electronic circuit 110 further comprises a selection and control unit 113 adapted or programmed for controlling the switches of the group of electric switches 109 so as to connect to the input terminals of the inverter 108, (a) in series mode Ms, the two photovoltaic modules supplying the highest currents, (b) in series mode Ms, the two photovoltaic modules supplying the intermediate currents and (c) in series mode Ms, the two photovoltaic modules supplying the lowest currents.

As in the previous example, the electronic circuit 110 is subject to a clock 114 adapted for supplying a clock signal Sh at pre-determined times, so as to trigger, upon each clock signal, a connection mode selection cycle.

Therefore, upon each clock signal, a measuring command is sent to the unit for measuring current values 111, a comparison command is sent to the comparison unit 112, and a selection and control command is sent to the selection and control unit 113.

For example, as indicated in FIG. 4, the measuring unit 111 measures the following values:
for the photovoltaic module 102: 8.0 Amperes,
for the photovoltaic module 103: 9.8 Amperes,
for the photovoltaic module 104: 8.9 Amperes,
for the photovoltaic module 105: 10.2 Amperes,
for the photovoltaic module 106: 8.2 Amperes,
and for the photovoltaic module 107: 9.3 Amperes.

After comparison of these measured current values by the comparison unit 112, the selection and control unit 113 controls the switches of the group of electric switches 109 such that the following connections are established:
the photovoltaic modules 102 and 106 are connected in series mode Ms to the input terminals of the inverter 108,
the photovoltaic modules 103 and 105 are connected in series mode Ms to the input terminals of the inverter 108,
and the photovoltaic modules 104 and 107 are connected in series mode Ms to the input terminals of the inverter 108.

It follows that the pairs of photovoltaic modules above, connected in series, are connected in parallel mode Mp to the input terminals of the inverter 108.

The corresponding connections are represented in FIG. 5.

The connection mode established above is maintained until the next connection mode selection cycle. Upon each connection mode selection cycle, the connection mode previously established is maintained or changed according to the result of the comparison of the measured values of the currents supplied by each photovoltaic module 102 to 107.

For example, upon the next cycle, the measuring unit 111 measures the following values:
for the photovoltaic module 102: 8.0 Amperes,
for the photovoltaic module 103: 10.1 Amperes,
for the photovoltaic module 104: 11 Amperes,
for the photovoltaic module 105: 10.2 Amperes,
for the photovoltaic module 106: 8.2 Amperes,
and for the photovoltaic module 107: 9.3 Amperes.

Then, the selection and control unit 113 controls the switches of the group of electric switches 109 such that the following connections are established:
the photovoltaic modules 104 and 105 are connected in series mode Ms to the input terminals of the inverter 108,
the photovoltaic modules 103 and 107 are connected in series mode Ms to the input terminals of the inverter 108,
and the photovoltaic modules 102 and 106 are connected in series mode Ms to the input terminals of the inverter 108.

It will be understood that the description above is not limited to six photovoltaic modules, associable in pairs, but can extend to any number of photovoltaic modules, which could be associated in suitable groups in series.

Figure 6:
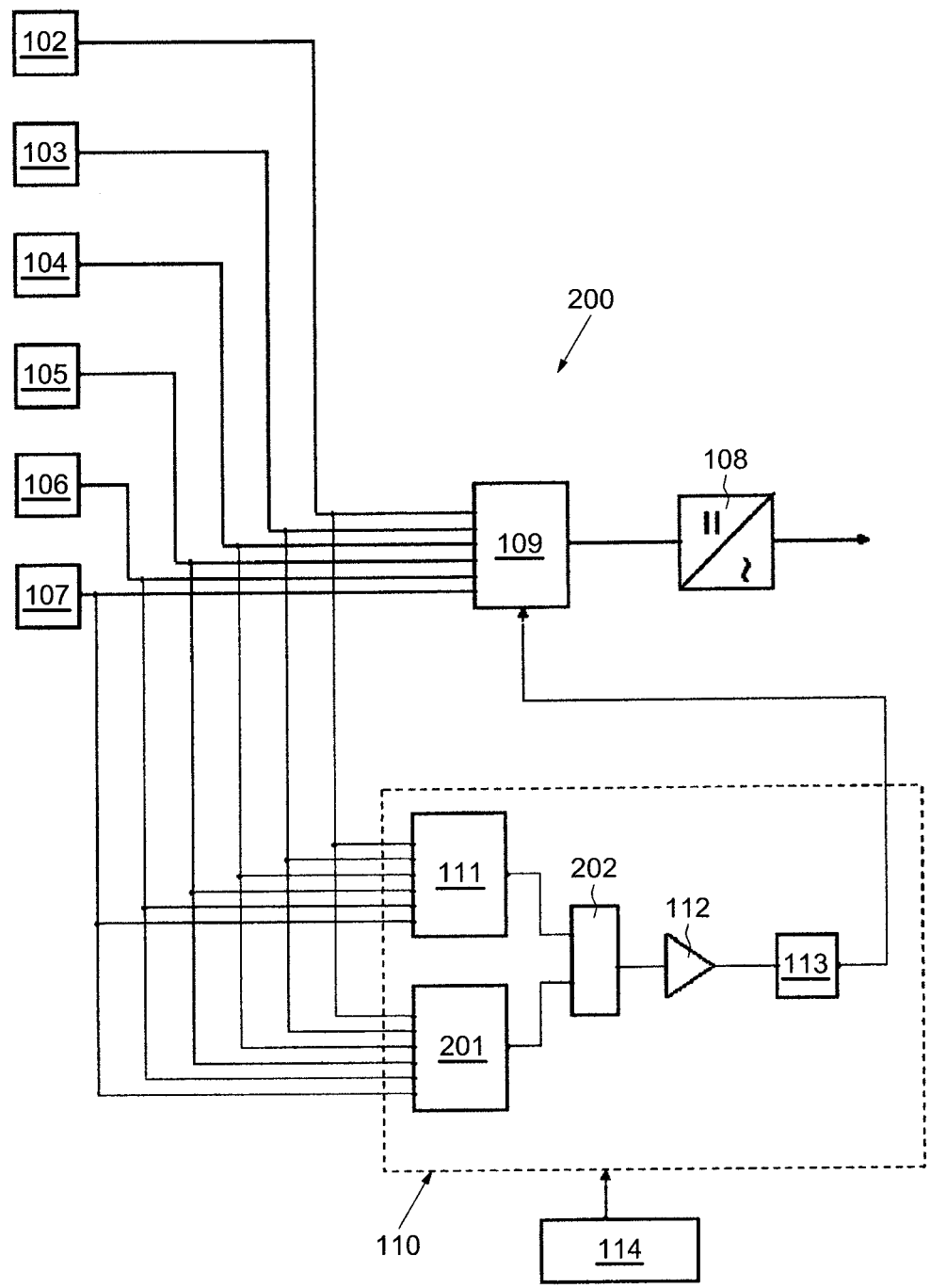
FIG. 6 is schematically represents another energy installation according to the present invention.

FIG. 6 shows an energy installation 200 which comprises, structurally, the energy installation 100 in FIGS. 4 and 5 and which further comprises a measuring unit 201 for measuring the voltages supplied by each of the photovoltaic modules 102 to 107 and a calculation unit 202 for calculating the electrical powers likely to be supplied by each photovoltaic module 102 to 107, from the measurements made by the units 111 and 201, using the calculation formulas known to those skilled in the art.

In this case, upon each clock signal Sh supplied by the clock 114, the calculation unit 202 calculates the electrical powers likely to be supplied by each photovoltaic module 102 to 107 from the corresponding values of currents and voltages supplied by the units 111 and 201 and the comparison unit 112 is adapted or programmed for comparing and classifying in ascending, or respectively descending order, the calculated electrical powers.

To establish the new connection mode, the selection and control unit 113 is adapted or programmed for controlling the switches of the group of electric switches 109 so as to connect, to the input terminals of the inverter 108, (a) in series mode Ms, the two photovoltaic modules supplying the electrical powers with the highest values, (b) in series mode Ms, the two photovoltaic modules supplying the electrical powers with the intermediate values, and (c) in series mode Ms, the two photovoltaic modules supplying the electrical powers with the lowest values. As in the previous example, there are fifteen possible combinations.

In a simplified alternative, only the signals coming from the current measuring sensors 111 could be considered, while estimating that the voltages at the terminals of the modules are almost the same.

According to an alternative embodiment of the installation in FIG. 6, upon each clock signal Sh supplied by the clock 114, the calculation unit 202 is adapted or programmed for calculating, using the calculation formulas known to those skilled in the art, the total electrical power likely to be supplied to the inverter 108 in each of the fifteen possible combinations in pairs of the photovoltaic modules 102 to 107. The comparison unit 112 is adapted or programmed for comparing the total calculated powers.

The selection and control unit 113 is adapted or programmed for controlling the switches of the group of electric switches 109 so as to connect, to the input terminals of the inverter 108, the photovoltaic modules 102 to 107 to establish the connection mode corresponding to the combination of connections supplying the inverter 108 with the highest total electrical power.

The selection of a combination of connections can be subject to an additional condition which depends on the input voltage capable of being borne by the inverter 108.

To that end, the calculation unit 202 is adapted for calculating the voltage Ud supplied to the input of the inverter 108 for each combination of connections and the selection and control unit 113 is subject to a value or a reference or setpoint range Ur characterizing the inverter 108, for example a maximum voltage and/or a minimum voltage and/or a range of voltages.

The comparison unit 112 and the selection and control unit 113 are adapted or programmed so as to rule out the combination(s) of connections supplying total electrical powers which are associated with input voltages that do no comply with said value or range Ur. The selection and control unit 113 selects and establishes the compatible, higher performance combination of connections.

Figure 7:
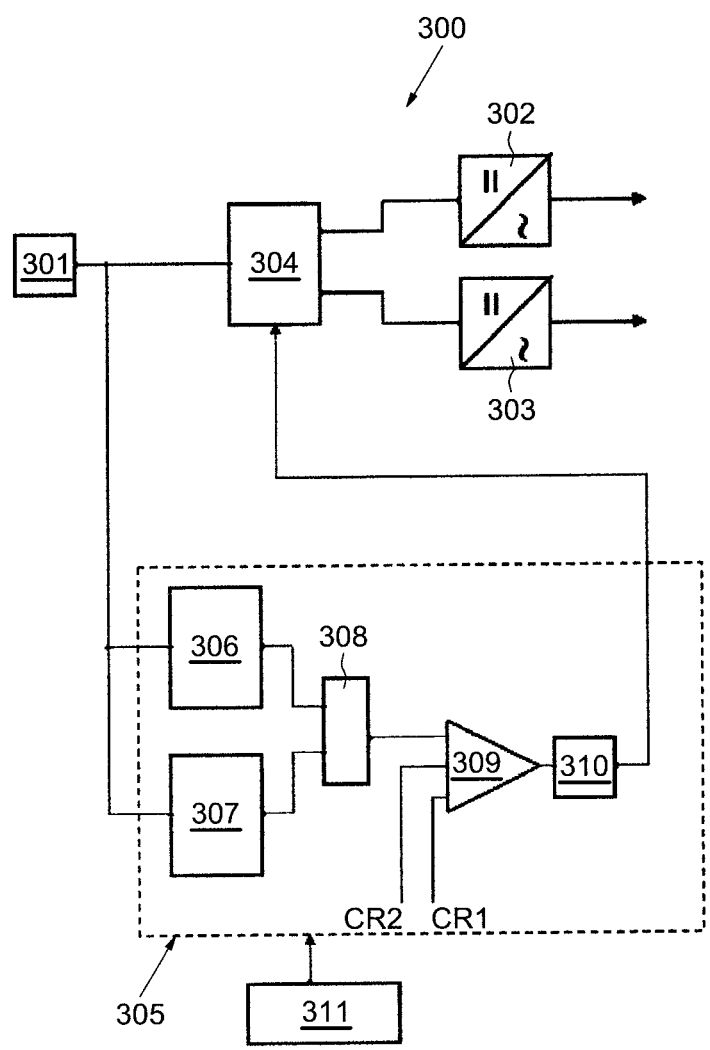
FIG. 7 is schematically represents another energy installation according to the present invention.
Figure 8:
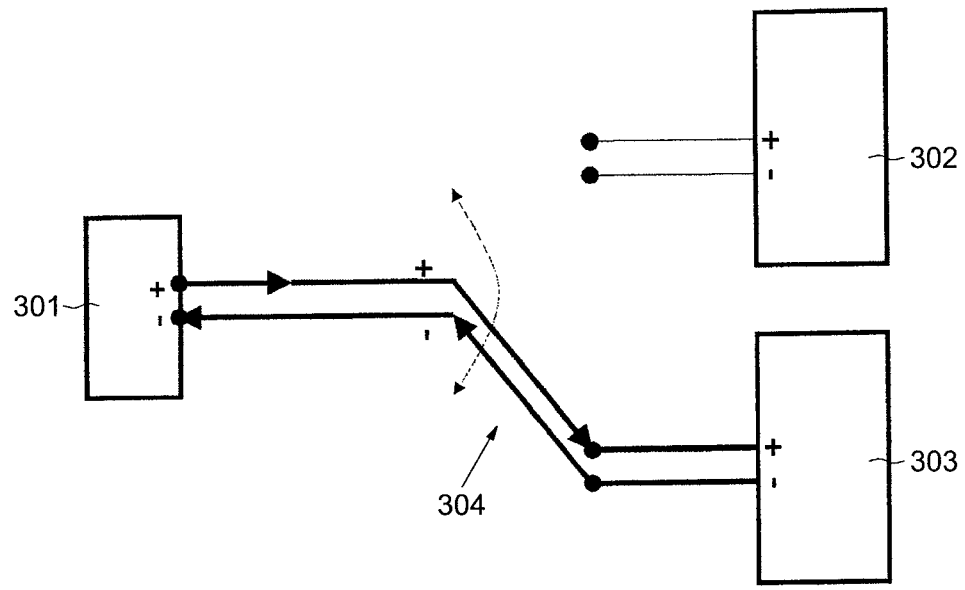
FIG. 8 is schematically represents an operating mode of the energy installation in FIG. 7.
Figure 9:
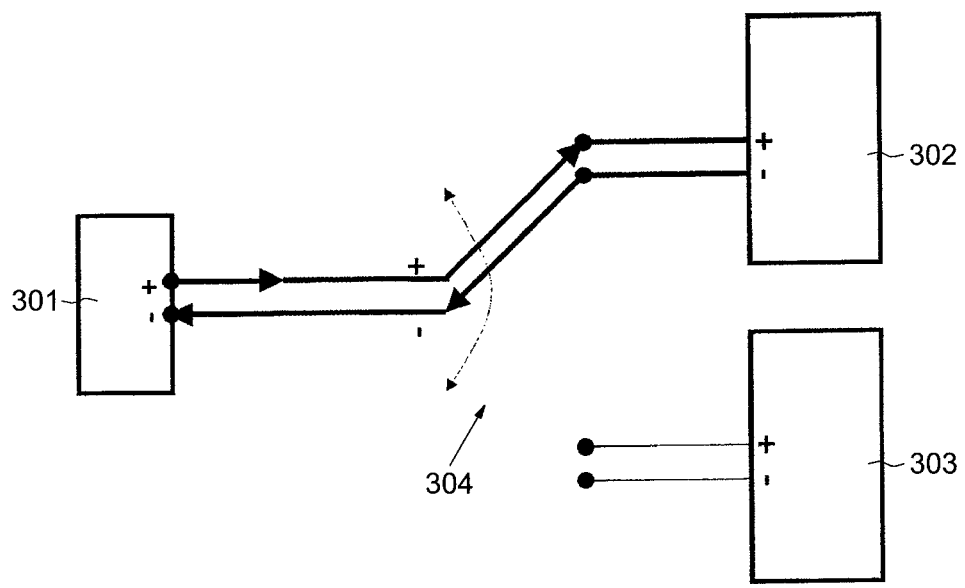
FIG. 9 is schematically represents another operating mode of the energy installation in FIG. 7.

FIGS. 7 to 9 show an energy installation 300 which comprises a photovoltaic module 301 and two inverters 302 and 303, an electric switch 304 mounted between the output terminals of the photovoltaic module 301 and the input terminals of the inverters 302, and an electronic circuit 305 for managing and controlling the switch 304 to selectively link the photovoltaic module 301 either to the inverter 302 or to the inverter 303.

The inverters 302 and 303 are chosen such that they have different operating features or magnitudes and/or ranges of operating magnitudes. Inverters are commonly characterized by a performance curve linking input electrical powers to output electrical powers. To properly use an inverter, it is desirable for the input electrical power to be equal to values in the highest performance zone.

The electronic management and control circuit 305 comprises a measuring unit 306 for measuring the current and a measuring unit 307 for measuring the voltage, that are supplied by the photovoltaic module 301, and a calculation unit 308 for calculating the electrical power supplied by the photovoltaic module 301, using the calculation formulas known to those skilled in the art.

The electronic management and control circuit 305 further comprises a comparison unit 309 adapted or programmed for comparing the electrical power calculated with the reference values CR1 and CR2 in the highest performance zone for each inverter 302 and 303, and a selection and control unit 310 adapted or programmed for controlling the switch 304 so as to switch the inverter 301 to the inverter adapted for supplying the best performance.

As in the previous examples, upon each clock signal Sh supplied by a clock 311, the units 306 and 307 measure the current and the voltage supplied by the photovoltaic module 301, the unit 308 calculates the corresponding electrical power, the unit 309 compares this calculated power with the reference values CR1 and CR2 and the unit 310 places the switch in a corresponding connection mode so as to switch the inverter 301 to the inverter adapted for delivering the best performance, by maintaining the previous connection mode or by changing inverter.

For example, the inverter 302 can have an optimal performance range containing a maximum value equal to 1,000 Watts and the inverter 303 can have an optimal performance range containing a maximum value equal to 500 Watts, these performance ranges having a common switch value for example equal to 650 Watts.

If the value of the calculated electrical power, likely to be supplied by the photovoltaic module 301, is equal for example to 400 Watts, the electronic management and control circuit 305 will connect the photovoltaic module 301 to the inverter 303. This is the case represented in FIG. 8.

If the value of the calculated electrical power, likely to be supplied by the photovoltaic module 301, is equal for example to 800 Watts, the electronic management and control circuit 305 will connect the photovoltaic module 301 to the inverter 302. This is the case represented in FIG. 9.

According to another embodiment, the photovoltaic module 301 could comprise part of the installation 1 described with reference to FIGS. 1 to 3 or the installation 100 described with reference to FIGS. 4 and 5 or the installation 200 described with reference to FIG. 6.

Indeed, instead of the photovoltaic module 301, provision could be made to connect, in the first case, the output terminals of the switch 6 or, in the second case, the output terminals of the switch 109, to the input terminals of the switch 304 and to the measuring units 306 and 307.

Upon the clock signal Sh, the electronic circuit 7 or the electronic circuit 110 would first fulfill their functions as described previously and secondly the electronic circuit 305 would do so, taking as the origin the output terminals of the switch 6 or the output terminals of the switch 109.

Figure 10:
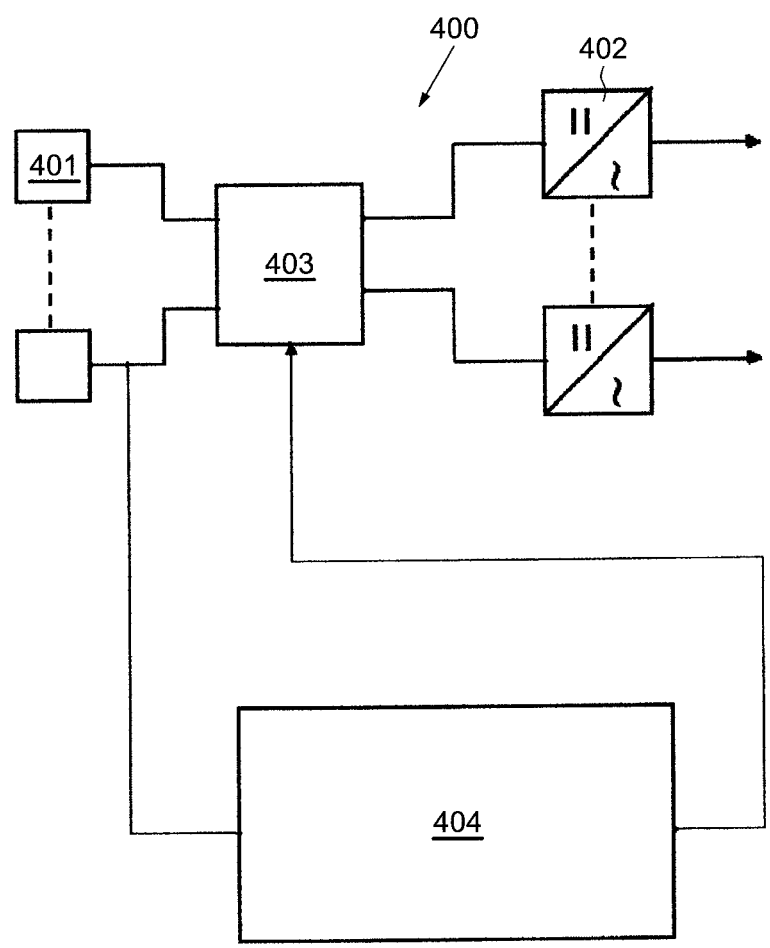
FIG. 10 is schematically represents another energy installation according to the present invention.

Now, from the examples that have just been described, a more general energy installation 400 is proposed in FIG. 10, which comprises a number N of photovoltaic modules 401, a number M of inverters 402, a switch unit 403 for selectively linking the photovoltaic modules 401 to the inverters 402.

The energy installation 400 further comprises an electronic circuit 404 for managing and controlling the switch unit 403 according to the measured or calculated or reference or performance or operating or setpoint magnitudes, coming from the photovoltaic modules 401, and possibly the inverters 402, to establish, at pre-determined times defined by a clock and selectively, a specific connection mode of connecting the photovoltaic modules 401 to the inverters 402, in accordance with a program.

For example, this program can be adapted or programmed for searching for and then establishing the most appropriate specific mode or specific combination of connections so that one, or some of, or all the inverters supply the highest possible global output electrical power during each period, estimated according to the measurements of the currents and/or the voltages and/or the powers calculated upon each selection and control cycle.

Figure 11:
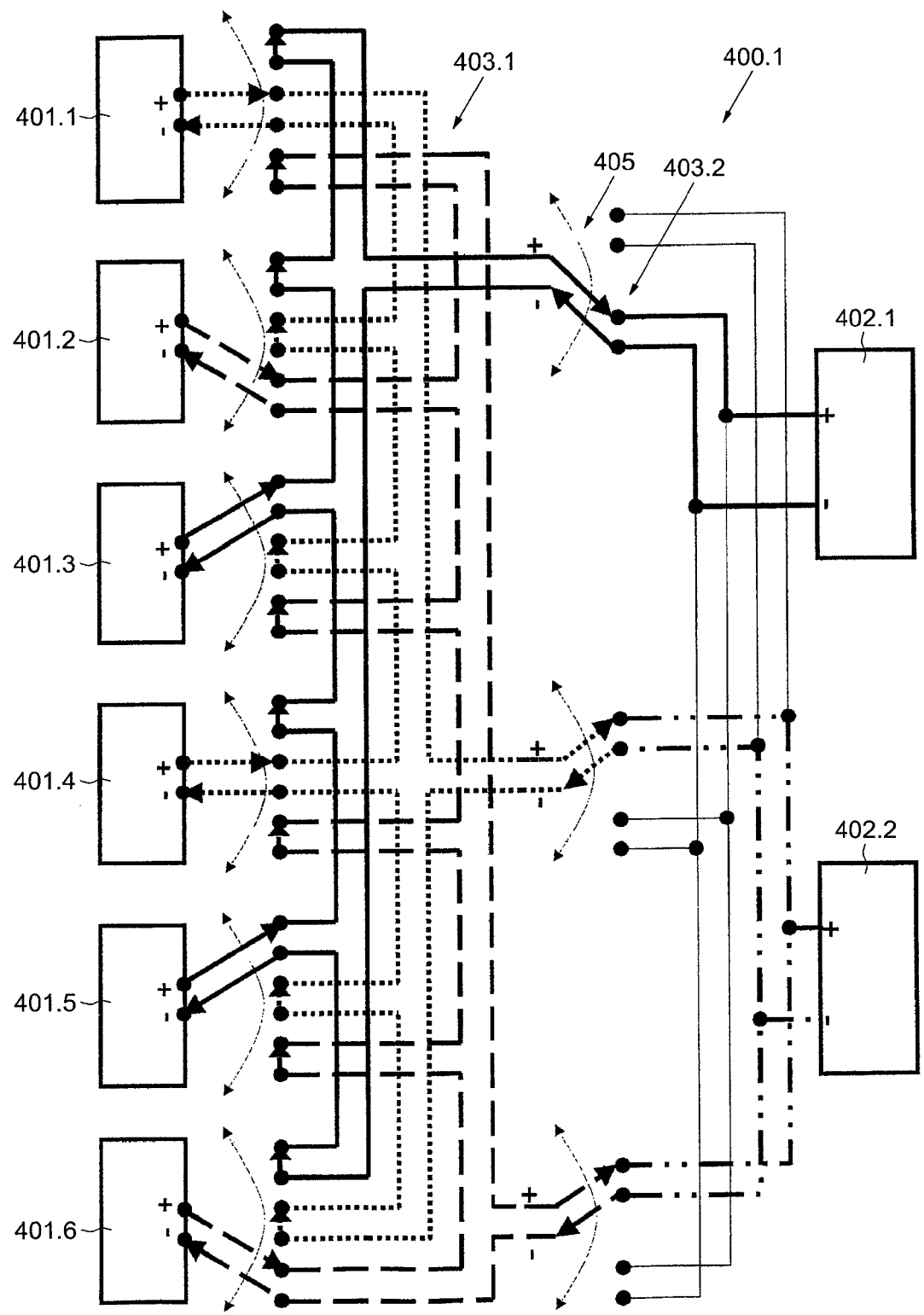
FIG. 11 is schematically represents another energy installation according to the present invention, based on the one in FIG. 10.

According to a specific embodiment represented in FIG. 11, the energy installation 400.1 comprises six photovoltaic modules 401.1 to 401.6 and two inverters 402.1 and 402.2.

The switch unit 403 comprises a group of switches 403.1 and a group of switches 403.2.

The electronic circuit 404 comprises the adapted means of the electronic circuit 110 in FIG. 4 or 6, so as to selectively establish groups or modes of connections in series in pairs of photovoltaic modules 401.1 to 400.6, to a pair of terminals 405.

The electronic circuit 404 further comprises the adapted means of the electronic circuit in FIG. 9, so as to selectively establish a link between the pair of terminals 405 and either the inverter 402.1, or the inverter 402.2.

As in the example described with reference to FIG. 6, the choice of a combination of connections can be subject to additional conditions depending on the input voltages and/or the input powers capable of being borne by the inverters 402.1 and 402.2.

That is why the electronic management and control circuit 404 can be adapted or programmed for selecting a combination of connections or a connection mode compatible with the voltages and/or the powers capable of being borne by the inverters 402.1 and 402.2

According to an alternative embodiment, the electronic circuit 404 can be adapted and programmed for selecting and constituting two groups of photovoltaic modules, one of which comprises some of the photovoltaic modules and the other comprises the other photovoltaic modules, so as to link these groups respectively and selectively to the inverters 402.1 and 402.2 in accordance with their features.

By extension, upon each selection and control cycle, by classifying for example the values of the currents supplied respectively by the N photovoltaic modules of an installation, the electronic circuit 404 can be adapted and programmed for selecting and constituting selectively x groups consisting of y photovoltaic modules in series and/or in parallel and for selectively linking these groups in series and/or in parallel to the inputs of one or more inverters, the sum of the y being equal to or lower than N in the event that certain photovoltaic modules are disconnected by the program. Then, the electronic circuit 404 controls the switch unit 403 to establish the selected combination of connections and to maintain it until the next selection cycle.

The photovoltaic modules indicated in the examples described can comprise photovoltaic structures consisting of one or more panels with photovoltaic cells or complex photovoltaic structures also comprising photovoltaic modules and series/parallel switches.

The installations that have just been described have many advantages. In particular, their operating modes can take the sunlight and environmental conditions of the determined places in which they are placed into account, in particular when certain photovoltaic modules may be at least partly in the shade during a day. Their operating modes can also take into account the variations in the individual conditions of the photovoltaic modules, in particular their temperatures. Therefore, even if the individual performances of some of the photovoltaic modules of an installation are affected, the performance of this installation would not however be significantly affected. In addition, their operating modes can take the operating conditions of receiving units, such as inverters, into account to obtain a good performance.

Moreover, the switching units or switches provided in the installations described, with one or more successive switching stages, may comprise, in a manner well-known per se, programmed or programmable electronic power switches and/or relays.

The present invention is not limited to the examples described above. In particular, energy installations can be designed that comprise all and any combinations of the examples described, without limitation to the connection modes.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for operating an energy installation comprising at least two photovoltaic modules linked to an inverter, the method comprising:
   (a) providing switching means to electrically arrange the photovoltaic modules in parallel or in series,
   (b) measuring current values and voltage values supplied individually by each photovoltaic module;
   (c) calculating or choosing at least one of (i) a first electrical magnitude according to the values measured in the case that the photovoltaic modules are arranged in parallel, or (ii) a second electrical magnitude according to the values measured in the case that the photovoltaic modules are arranged in series;
   (d) comparing the first and second electrical magnitudes with each other or with a reference magnitude; and
   (e) selecting an arrangement of the photovoltaic modules according to the result of the comparison.

2. The method of claim 1, wherein the first and second electrical magnitudes are first and second electrical powers and wherein the arrangement corresponding to the highest power supplied by the energy installation is selected.

3. The method of claim 1, wherein the first and second electrical magnitudes are current values and wherein the arrangement corresponding to the highest current supplied by the energy installation is selected.

* * * * *